United States Patent [19]

Strauer

[11] Patent Number: 4,952,870
[45] Date of Patent: Aug. 28, 1990

[54] COMPACT TAUT BAND METER MOVEMENT ASSEMBLY

[75] Inventor: Terry Strauer, Ottawa, Ohio

[73] Assignee: Triplett Corporation, Bluffton, Ohio

[21] Appl. No.: 338,169

[22] Filed: Apr. 14, 1989

[51] Int. Cl.[5] .............................................. G01R 1/00
[52] U.S. Cl. ........................... 324/154 R; 324/151 A; 324/155
[58] Field of Search .................. 324/146, 150, 151 R, 324/151 A, 154 R, 154 PB, 155, 157

[56] References Cited

U.S. PATENT DOCUMENTS

| | | |
|---|---|---|
| 2,400,308 | 5/1946 | Klepp . |
| 2,430,317 | 11/1947 | Wilson et al. . |
| 2,517,171 | 8/1950 | Bernreuter . |
| 2,518,609 | 8/1950 | Fogle . |
| 2,875,410 | 2/1959 | Lamb . |
| 2,887,657 | 5/1959 | Lamb et al. . |
| 3,551,812 | 12/1970 | Mothes . |
| 3,586,976 | 6/1971 | Woolner . |
| 3,587,014 | 6/1971 | Nador . |
| 3,593,135 | 7/1971 | Schwartz ....................... 324/151 A |
| 3,602,815 | 8/1971 | Rumpelein . |
| 3,764,909 | 10/1973 | Pearson . |
| 3,878,462 | 4/1975 | Orth et al. ............................ 324/154 |
| 3,899,736 | 8/1975 | Sakaguchi ...................... 324/154 R |
| 3,962,633 | 6/1976 | Nadeau . |
| 4,024,472 | 5/1977 | Nador et al. . |
| 4,140,969 | 2/1979 | Boreas . |
| 4,206,406 | 6/1980 | Scannell et al. . |
| 4,223,266 | 9/1980 | Scannell . |
| 4,237,418 | 12/1980 | Van Bennekom et al. . |
| 4,238,731 | 12/1980 | Pearson ........................... 324/151 A |
| 4,253,062 | 2/1981 | Scannell et al. . |
| 4,564,806 | 1/1986 | Kaise . |

Primary Examiner—Reinhard J. Eisenzopf
Assistant Examiner—Robert W. Mueller
Attorney, Agent, or Firm—Fleit, Jacobson, Cohn, Price, Holman & Stern

[57] ABSTRACT

A taut band meter movement assembly comprising a one piece movement frame functioning to hold and center a magnet core, and hold and center spring members for supporting a ligament wire about which a moving coil rotates. The molded one piece frame holds and centers the magnet with a snap fit between two side members having slot engaging edges for engaging slots in the magnet. For holding and centering the spring members, two pairs of circular flat discs are provided having ring receiving slots between each pair of discs for receiving ring members of said spring members. Rotation of said spring members 90° seat the spring members within a magnet ring which serves to protect the movement assembly from physical damage and shields the magnet from any magnetic influences outside the magnet ring.

21 Claims, 4 Drawing Sheets

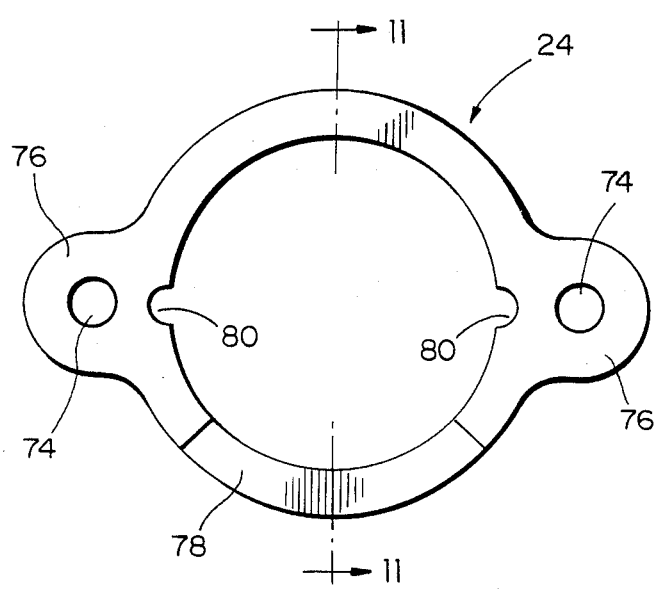
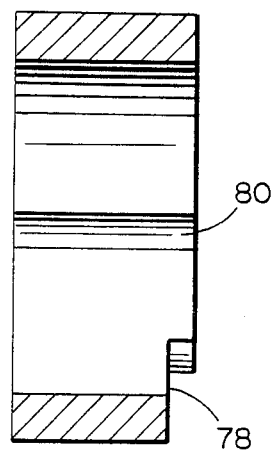
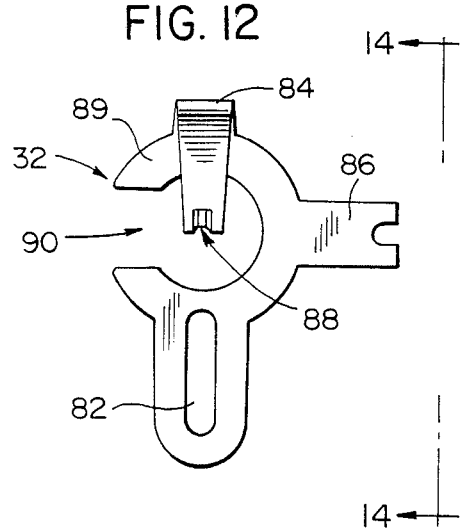
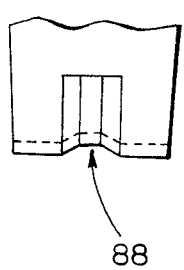
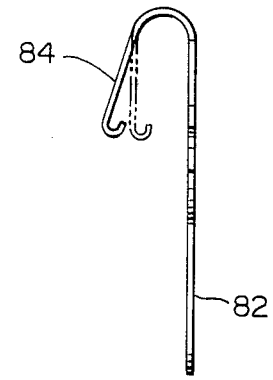

COMPACT TAUT BAND METER MOVEMENT ASSEMBLY

BACKGROUND OF THE INVENTION

The present invention relates to a taut band meter movement assembly and more particularly to a meter movement assembly constructed of fewer and less expensive parts.

In the field of taut band instruments, it is a primary importance to construct an instrument which performs accurately but is inexpensive to build. A typical taut band instrument assembly comprises a moving coil, a magnetic core, a magnet ring, a frame or holding member for supporting the magnetic core and allowing movement of the moving coil about the magnetic core, a taut band or ligament wire serving as an axis of rotation of the moving coil, and spring members attached to the holding frame for supporting the frame on the ligament wire. In addition, various small supporting elements are required to carefully balance the moving coil in the assembly.

Presently, taut band meter movement assemblies are complex in structure and therefore expensive to build. See for example U.S. Pat. Nos. 3,551,852 to Mothes, and U.S. Pat. No. 4,564,806 to Kaise. Both of the taut band devices disclosed in these patents comprise many parts and have a relatively complex assembly procedure. For example, both devices include a two piece holding or movement frame for supporting a magnetic core surrounded by a moving coil. Furthermore, the attachment of spring members to the movement frame requires additional washer and grommet elements.

SUMMARY OF THE INVENTION

It is a primary object of the present invention to provide a taut band meter movement assembly having less parts than conventional taut band meter movement assemblies and thus being inexpensive and easy to manufacture.

It is another object of the present invention to provide a taut band meter movement assembly having basic parts designed to perform several functions, and thus reduce the total amount of required parts.

It is another object of the present invention to provide a taut band meter movement assembly having a one piece movement frame which provides for several functions in the meter movement assembly.

It is yet a further object of the present invention to provide a movement frame in a taut band meter movement assembly which supports spring members without the use of additional parts to attach the spring member to the movement frame.

It is another object of the present invention to provide a taut band meter movement assembly including a magnet core having a tapered cup shape for providing a more linear movement in the meter movement assembly.

The taut band meter movement assembly of the present invention comprises a one piece molded movement frame for holding and centering a magnet core, holding and centering spring members, positioning the movement of a moving coil in a magnet ring, and holding and centering a dial needle.

The molded frame holds and centers the magnet with a snap fit via two triangular edge members received by two corresponding slots in the magnet. The spring members are held and centered by the frame in one simple construction step. To keep the spring members in a seated position, the frame includes a taper having an interfacing radius which is oversized at the top and the same size as the spring at the bottom. Two separated flats or washer members are formed as part of the frame and cut out in a "C" shape. The spring is slid between the flats of the frame and turned 90° to a seated position. The flats on the frame for each spring member are oriented at 90° relative to each other to allow for a right and left justified meter.

The spring members are of conventional taut band shape for holding and maintaining the tension on a ligament wire. Additionally, at least one spring member includes a zero adjust slot.

A magnetic ring is provided for supporting and surrounding the movement frame. Half circle slots are cut in the inside core of the ring to hold the movement frame in place during assembly. Holes are provided in the magnetic ring to mount and center the movement frame with two thread forming screws. Preferably, the magnet ring is longer than the armature assembly so that the bottom of the assembly is not left unprotected, therefore reducing the risk of damage to the meter movement assembly.

The above and other objects, advantages, and features of the present invention will become more apparent when reference is made to the following description taken in conjunction with the accompanying drawings.

BRIEF DESCRIPTION OF THE DRAWINGS

FIG. 10 is a plan view illustrating the magnet ring of the taut band meter movement assembly of the present invention.

FIG. 11 is a sectional view taken through line 11—11 of FIG. 10.

FIG. 12 is a plan view illustrating a spring member of the taut band mete movement assembly of the present invention.

FIG. 13 is an enlarged view of a portion of the spring illustrated in FIG. 12.

FIG. 14 is a side view as seen from line 14–14 of FIG. 12.

DETAILED DESCRIPTION OF THE DRAWINGS

Figure 1:
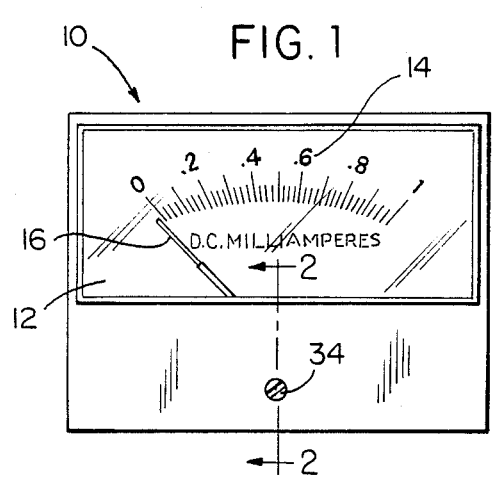
FIG. 1 is a front view of the taut band meter in constructed form illustrating the display face and dial needle of the taut band meter of the present invention.

Referring first to FIG. 1, the taut band meter in accordance with the present invention is shown at 10. Meter 10 includes a front face display 12 having a scale 14 thereon. A dial needle 16 is provided for indicating a measured value on the scale 14.

FIGS. 2-4 and 4a illustrate the taut band meter movement assembly 20 of the present invention in detail. Meter movement assembly 20 comprises movement frame 22, magnet ring 24, and moving coil 26 surrounding the frame 22 and a magnet 28 held by frame 22. Frame 22 slidably mounts inside magnet ring 24 and is secured by threaded screws 30 which pass through frame 22 into ring 24.

Frame 22 holds spring 32 in position relative to the magnet ring 24. A zero adjust screw 34 is provided which extends from the exterior of the meter casing 36 through an opening 38 in spring 32. A ligament wire 40 passes through end portions of frame 22 and connects with moving coil 26 and dial needle 16 attached to coil 26. Typically, a rear spring member 42 is provided for attachment to movement frame 22.

The connection and operation of the parts illustrated in FIGS. 2-4, and 4a, will become more apparent when reference is made to FIGS. 5-9, illustrating movement frame 22 in more detail. The one piece movement frame 22 is molded out of 25% glass filled delrin. For holding and centering the magnet 28, frame 22 has side members 44 which include inner trapezoidal projections 46 and inner edge members 48. The magnet 28 is seated between side members 44 and extends between trapezoidal projections 46 and inner flat regions 50. Edge members 48 fit in corresponding slots of magnet 28, discussed in more detail hereinafter.

Figure 7:
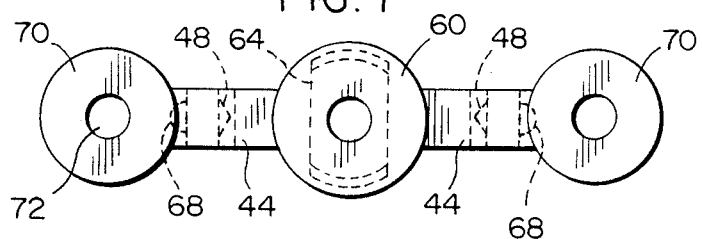
FIG. 7 is an end view as seen from line 7—7 of FIG. 6.
Figure 8:
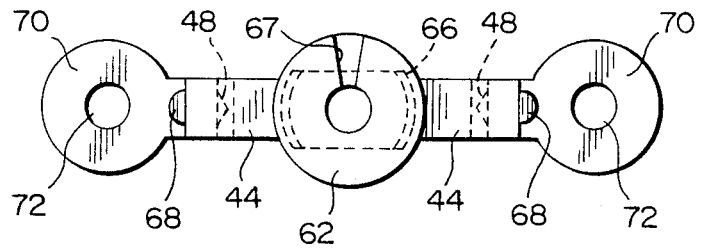
FIG. 8 is an end view as seen from line 8—8 of FIG. 6.
Figure 9:
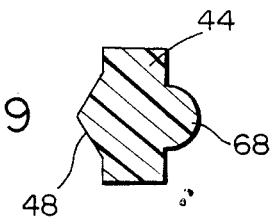
FIG. 9 is a sectional view taken through line 9—9 of FIG. 6.

Frame 22 includes two pairs of flat discs 52 and 54 formed at the ends of side members 44. Each disc pair 52 and 54 comprises inner circular flats 56 and 58, respectively, as well as outer circular flats 60 and 62, respectively. A "C" shape cut 64 is provided between flats 56 and 60. Similarly, "C" shape cut 66 is provided between flats 58 and 62. As shown in FIGS. 7 and 8, "C" shape cut 64 is oriented at 90° relative to "C" shape cut 66. Furthermore, flats 58 and 62 have a slot 67 cut at coinciding portions thereof for facilitating placement of ligament wire 40 through frame 22 to coil 26. Flat pairs 52 and 54 are provided for mounting spring members 32 and 42, respectively, as will be described hereinafter.

Figure 3:
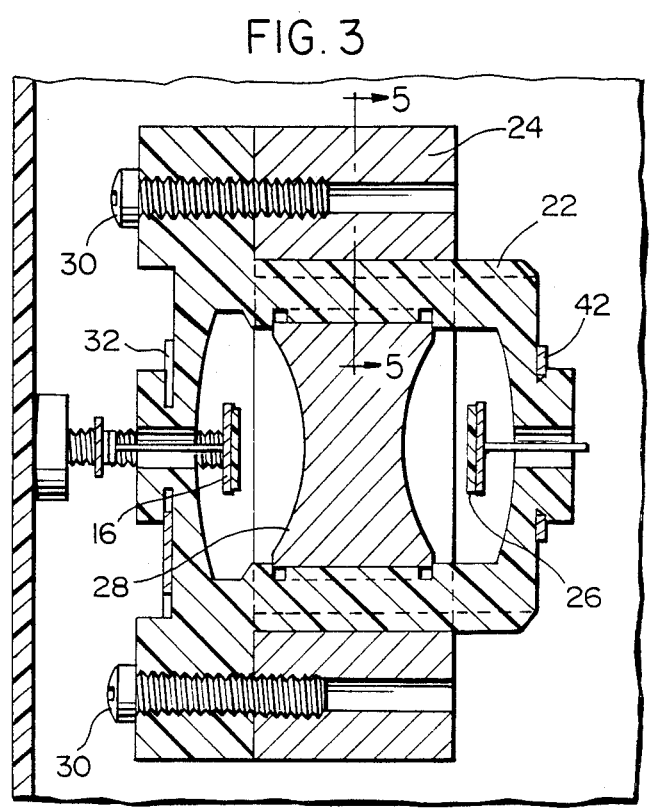
FIG. 3 is a sectional view taken through line 3—3 of FIG. 2.
Figure 2:
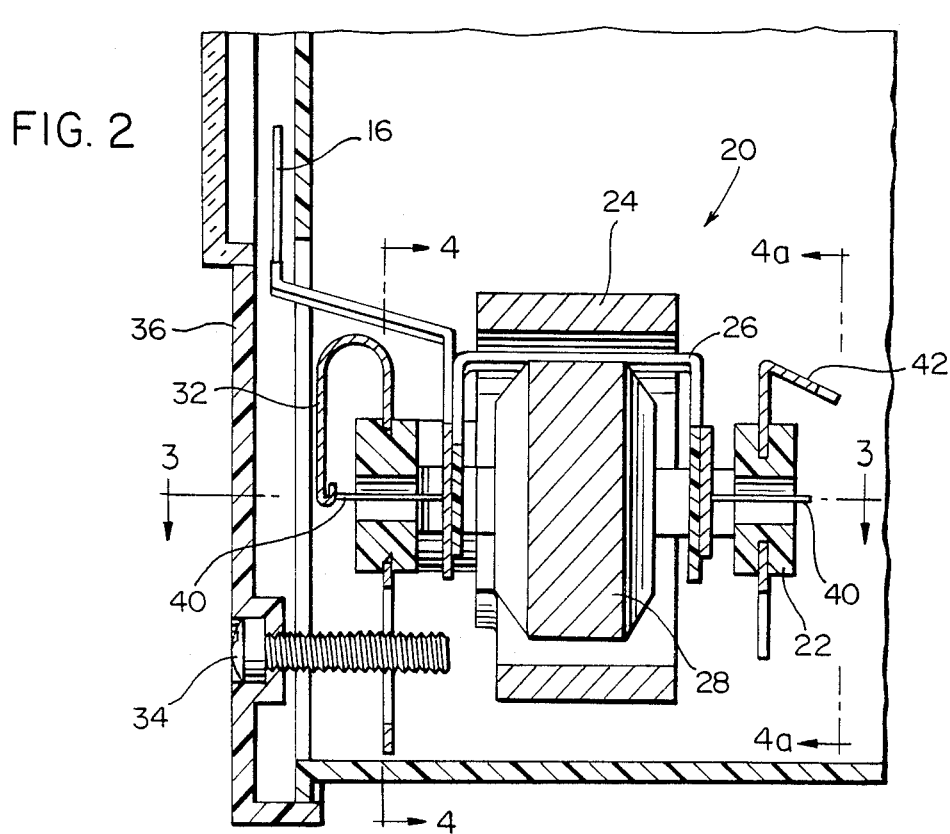
FIG. 2 is a sectional view taken through line 2—2 of FIG. 1, and illustrating the taut band meter movement assembly of the present invention.
Figure 4:
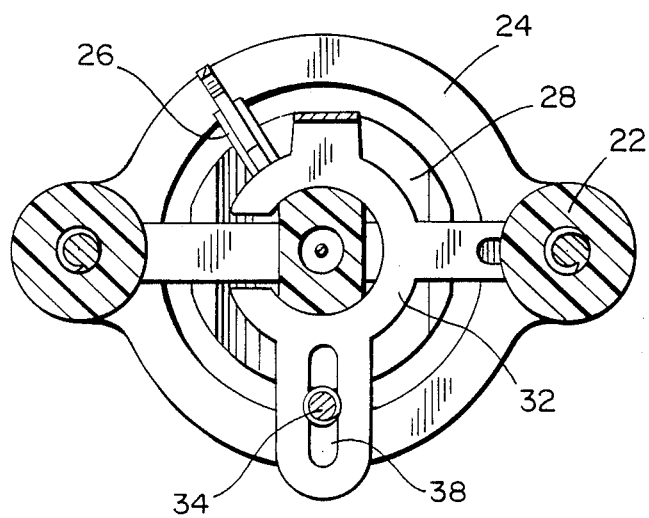
FIG. 4 is a sectional view taken through line 4—4 of FIG. 2.
Figure 4A:
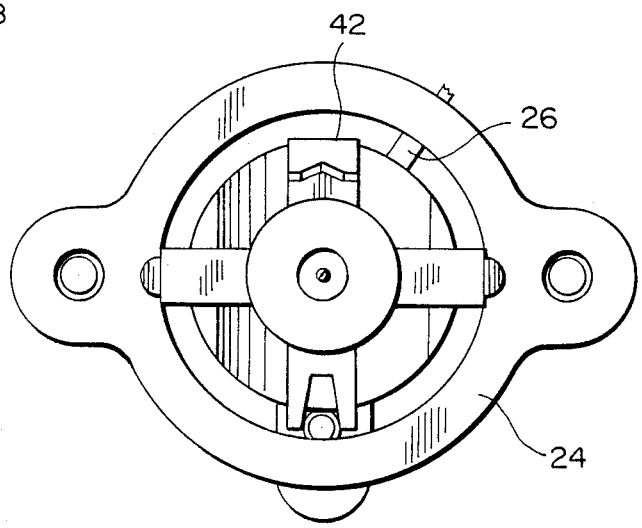
FIG. 4a is an end view as seen from line 4a—4a of FIG. 2.
Figure 5:
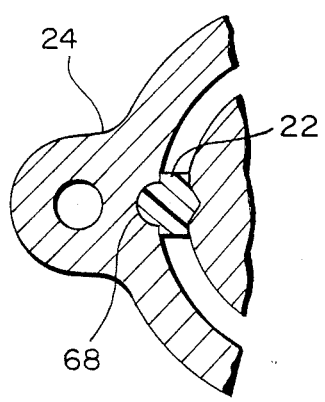
FIG. 5 is a sectional view taken through line 5—5 of FIG. 3.

To facilitate mounting of frame 22 into magnet ring 24, semi circular edge members 68 are provided along the exterior surface of side members 44. In addition, cylindrical screw casings 70 are provided having cylindrical holes 72 for receiving threaded screws 30 as illustrated in FIG. 3.

Referring now to FIGS. 10 and 11, magnet ring 24 is shown in more detail. Magnet ring 24 is preferably pressed and sintered out of ferrous powdered metal, and is pressed to the proper length to fit different assemblies without the use of spacers. As is well known in the art, sintering is a process used by manufacturers of powdered metal parts. The tooling to manufacture this part is made so that the length of the part can be easily adjusted at the time of manufacture. Holes 74 are provided through extension portions 76 for receiving screws 30. In addition, a 90° slot 78 is cut around the bottom of ring 24 to allow the bottom hook-up wire to pass through and connect to the corresponding spring. The purpose of the slot is to allow a hookup wire to fit between the magnet ring 24 and the bottom of the frame 22 without pinching off wire or affecting movement within the frame 22. Semicircular slots 80 are provided on the inner periphery of ring 24 to receive semicircular edge projections 68 of frame 22, as discussed above. Extension 76 further serves to protect the movement assembly 20 from any impact force subjected to ring 24. In addition, magnet ring 24 shields magnet core 28 from magnetic influences outside of the ring 24, and protects the meter movement assembly 20 from damage by absorbing the impact of external forces.

Turning now to FIGS. 12-14, spring member 32 is shown which includes a zero adjust opening or slot 82 and a ligament wire holding arm 84. Spring 32 is punched out of beryllium copper and has the conventional taut band spring shape in order to keep the tension on ligament wire 40. Spring 32 also has the standard extension 86 for soldering a hook-up wire to the spring 32. Wire holding arm 84 includes an indentation 88 for guiding ligament wire 40 through frame 22. Wire holding arm 84 is flexible to flex between the solid and dotted line positions illustrated in FIG. 14.

Spring 32 further includes a circular ring portion 89 having a break 90 for facilitating mounting onto frame 22. Spring 32 slides onto "C" shaped cut 64 between circular flats 56 and 60 and rotated 90° to a locked position where the spring 32 cannot be pulled from frame 22.

Similarly, spring 42 has a structure almost identical to that of spring 32, with the exception of the zero adjust slot 82. Furthermore, spring 42 is mounted onto "C" shaped slot 60 and rotated into a locked position, such position being perpendicular to the locked position of spring 32.

Figure 15:
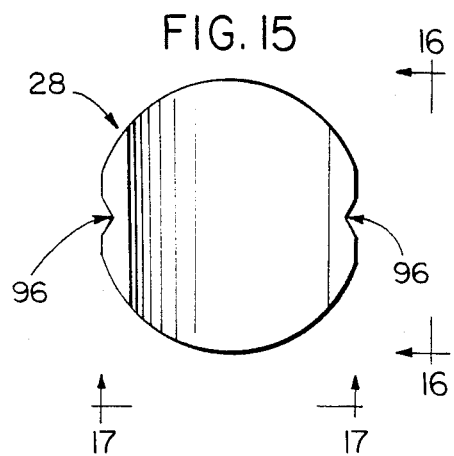
FIG. 15 is a plan view of the magnet of the taut band meter movement assembly of the present invention.
Figure 16:
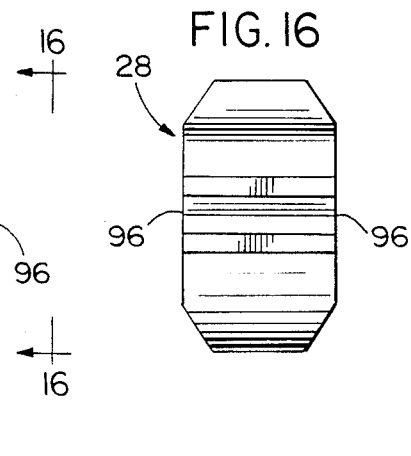
FIG. 16 is a side view as seen from line 16—16 of FIG. 15.
Figure 17:
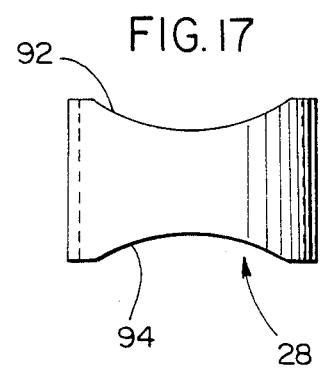
FIG. 17 is a side view as seen from line 17—17 of FIG. 15.
Figure 6:
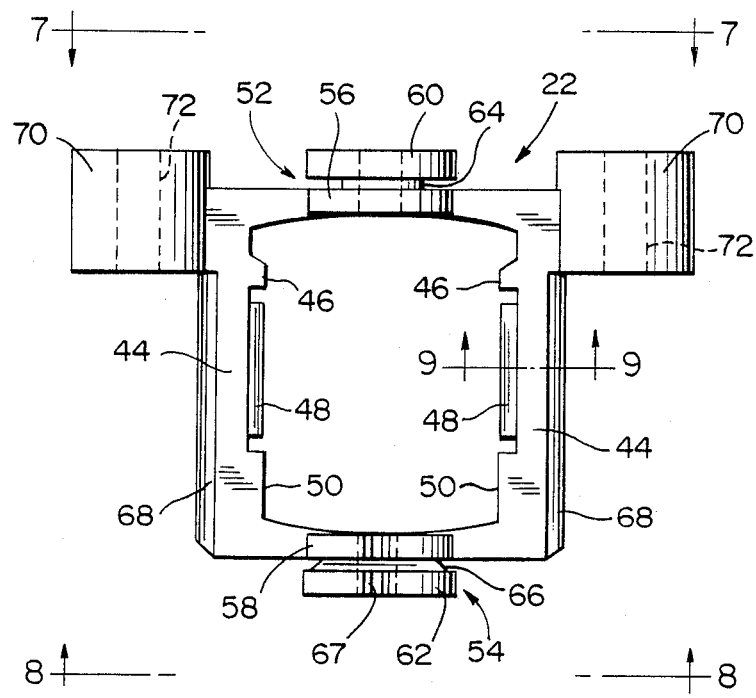
FIG. 6 is a top plan view of the movement frame of the taut band meter movement assembly of the present invention.

FIGS. 15-17 illustrate the magnet 28 in more detail. Magnet 28 is pressed out of a powdered ferromagnetic material and includes smooth tapered surfaces 92 and 94, giving magnet 28 a cup-shaped profile. This cup-shape provides for linear movements of moving coil 26 and also provides more clearance between the bottom and top of the magnet 28 and the coil 26. Two "V" shaped slots 96 are provided in the magnet for receiving inner edge members 48 of frame 22 to hold and center the magnet 28 in the frame 22, as discussed previously in conjunction with FIGS. 5-9.

The taut band meter movement assembly of the present invention provides for inexpensive and simple manufacturing since the assembly comprises fewer parts. The one piece movement frame in the present invention facilitates attachment of other parts without supplemental parts to assist in attachment. Specifically, no bushings or plastic forms are required to attach and correctly position the spring members onto the movement frame. The spring member of the present invention combines a zero adjust arm, tension spring and holding mechanism all in one part. Similarly, the magnet ring of the present invention mounts movement without additional 0.25" stand-offs in prior art assemblies. In addition, the movement frame itself is one piece, in contrast to prior art frames which are typically two pieces glued or otherwise assembled together around a magnet core. In the present invention, the magnet core simply snaps in the movement frame. Finally, accurate readings are obtained with the meter movement assembly of the present invention due to the precise and sturdy interfitting of the parts, and the linear movement of the movement coil provided by the cup-shaped magnet core.

The above description is intended by way of example only, and is not intended to limit the present invention in any way except as set forth in the following claims.

We claim:

1. A taut band meter movement assembly for indicating a measured value on a scale display, the assembly comprising:
   a magnet;
   a movement coil having opposite ends defining an axis about which said movement coil rotates;
   first and second spring members having respective first and second ligament wire holding arms;
   a ligament wire held by said ligament wire holding arms;
   a one piece movement frame including means for holding and centering said magnet, including means for holding and centering said first and second spring members, said first and second spring members supporting said movement coil via said ligament wire for permitting rotation of said movement coil around said magnet between said magnet and said movement frame;
   a dial needle attached to said movement coil for movement with said coil for indicating said measured value of said meter assembly on said scale display;
   a magnet ring for receiving, surrounding and attaching to said movement frame without any additional attachment element and for protecting said movement coil from impacts of external forces and for shielding said magnet from magnetic influences outside of said magnet ring.

2. The meter movement assembly of claim 1, wherein said magnet comprises two opposite sides, said opposite sides being formed of inward curved semicircular surfaces giving said magnet a cup-shaped profile.

3. The meter movement assembly of claim 1, and further including an adjustment screw and wherein said first spring member further includes a zero adjust slot for receiving said adjustment screw such that rotation of the adjustment screw alters the position of said dial needle to a predetermined zero reference point.

4. The meter movement assembly of claim 1, wherein said holding and centering means for said first and second spring members positions said first ligament wire holding arm of said first spring member 90° relative to said second ligament wire holding arm of said second spring member.

5. The meter movement assembly of claim 1, wherein said one piece movement frame is molded out of 25% glass filled delrin material.

6. The meter movement assembly of claim 1, wherein said holding and centering means of said movement frame for said magnet comprises first and second side members having opposing inner surfaces, said first and second side members including opposing projections, opposing slot engaging edges, and opposing flat region on said opposing inner surfaces, said magnet further including slots to receive said opposing slot engaging edges, said magnet snapping into place between said opposing projections and said opposing flat regions of said first and second side members.

7. A taut band meter movement assembly for indicating a measured value on a scale display, the assembly comprising:
   a magnet;
   a movement coil having first and second ends defining an axis about which said movement coil rotates;
   first and second spring members having first and second ligament wire holding arms, respectively, and having first and second ring engaging members, respectively;
   a ligament wire held by said first and second holding ligament wire holding arms;
   a one piece molded movement frame having first and second side members having opposing inner surfaces thereon, said first and second side members holding and centering said magnet between said opposing inner surfaces, said first and second side members including opposing projections, opposing slot engaging edges, and opposing flat regions on said opposing inner surfaces, said magnet including slots to receive said opposing slot engaging edges to snap into position between said opposing projections and said opposing flat regions of said first and second side members, said movement frame including first and second pairs of circular flat discs for mounting said first and second spring members, respectively, on said movement frame in the region of said first and second ends, respectively, of said movement coil, said first and second pairs of circular flat discs being separated to create first and second spring receiving slots, respectively, said first spring receiving slot receiving said first ring engaging member of said first spring member and said second spring receiving slot receiving said second ring engaging member of said second spring member, said first and second spring receiving slots being formed so that when said first and second spring members are rotated 90°, said spring members are placed in locked positions on said movement frame, said first and second spring members supporting said movement coil at said first and second ends, respectively, said ligament wire attaching to said first and second ligament wire holding arms of said first and second spring members, respectively, for allowing rotation of said movement coil about said magnet between said magnet and said movement frame;
   a dial needle attached to said movement coil for movement with said coil for indicating said measured value of said meter assembly on said scale display,
   a magnet ring for receiving, surrounding and attaching to said movement frame without any additional attachment elements but permitting movement of said movement coil, and for protecting said movement assembly from physical damage and for shielding said magnet from magnetic influences outside of said magnet ring.

8. The meter movement assembly of claim 7, wherein said first and second spring members are locked in position on said movement frame so that said first ligament wire holding arm of said first spring member is positioned 90° relative to said second ligament wire holding arm of said second spring member.

9. The meter movement assembly of claim 7, wherein said movement frame is molded out of 25% glass filled delrin material.

10. The meter movement assembly of claim 7, and further including a zero adjust screw, and wherein said first spring member further includes a zero adjust slot for receiving said zero adjust screw for moving said dial needle to a predetermined zero point position on said scale display.

11. The meter movement assembly of claim 7, wherein said magnet comprises two opposite sides, said opposite sides being formed of inward curved semicircular surfaces giving said magnet a cup-shaped profile.

12. The meter movement assembly of claim 7, wherein said movement frame includes slot engaging edges on outer surfaces of said first and second side members and said magnet ring includes corresponding slots for receiving said slot engaging edges of said movement frame so that said movement frame slides into said magnet ring to a seated and secure position.

13. The meter movement assembly of claim 12, wherein said movement frame includes screw receiving cylinders, and said magnet ring includes holes aligned with said screw receiving cylinders of said movement frame, so that said movement frame and said magnet ring can be securely fixed together by threaded screws inserted through said screw receiving cylinders of said movement frame and into said holes of said magnet ring.

14. The meter movement assembly of claim 7, wherein said first and second pairs of circular flat discs include center holes for allowing insertion of said ligament wire attached to said first and second ligament wire holding arms, through said movement frame for connection with said movement coil.

15. The meter movement assembly of claim 14, wherein said first pair of circular flat discs includes a slot cut in said discs through to said center hole for facilitating threading of said ligament wire through said center hole.

16. An electrical meter for measuring electrical quantities of a device under test and displaying a measured value on a scale display, said meter having a taut band meter movement assembly, said assembly comprising:
a magnet;
a movement coil having first and second ends defining an axis which said movement coil rotates about;
first and second hook-up wires for electrically connecting to said device under test;
first and second spring members having first and second ligament wire holding arms, respectively, and first and second extensions for providing an electrical connection between said first and second hook-up wires and said first and second spring members, respectively;
a ligament wire held by said first and second ligament wire holding arms;
a one piece movement frame including means for holding and centering said magnet without any additional attachment elements, including means for holding and centering said spring members on said frame in the region of said first and second ends of said movement coil without any additional attachment elements, said first and second spring members supporting said movement coil via said ligament wire for allowing rotation around said magnet between said magnet and said movement frame;
a dial needle attached to said movement coil for movement with said coil for indicating a measured electrical value on a scale display from said device under test;
a magnet ring for surrounding and attachment to said movement frame without any additional attachment elements and for protecting said movement assembly from external forces and for shielding said magnet from any magnetic influences outside of said magnet ring.

17. The electrical meter of claim 16, wherein said first and second spring members are locked in position on said movement frame so that said first ligament wire holding arm of said first spring member is positioned 90° relative to said second ligament wire holding arm of said second spring member.

18. The electrical meter of claim 16, wherein said movement frame is molded out of 25% glass filled delrin material.

19. The electrical meter of claim 16, and further including a zero adjust screw, and wherein said first spring member further includes a zero adjust slot for receiving said zero adjust screw for moving said dial needle to a predetermined zero point position on said scale display.

20. The electrical meter of claim 16, wherein said movement frame includes screw receiving cylinders, and said magnet ring includes holes aligned with said screw receiving cylinders of said movement frame, so that said movement frame and said magnet ring can be securely fixed together by threaded screws inserted through said screw receiving cylinders of said movement frame and into said holes of said magnet ring.

21. The electrical meter of claim 16, wherein said magnet comprises two opposite sides, said opposite sides being formed of inward curved semicircular surfaces giving said magnet a cup-shaped profile.

* * * * *